(12) United States Patent
Chang et al.

(10) Patent No.: US 9,018,084 B2
(45) Date of Patent: Apr. 28, 2015

(54) TAPERED FIN FIELD EFFECT TRANSISTOR

(71) Applicant: International Business Machines Corporation, Armonk, NY (US)

(72) Inventors: Josephine B. Chang, Mahopac, NY (US); Michael A. Guillorn, Yorktown Heights, NY (US); Chung-Hsun Lin, While Plains, NY (US); Ryan M. Martin, Yorktown Heights, NY (US); Jeffrey W. Sleight, Ridgefield, CT (US)

(73) Assignee: International Business Machines Corporation, Armonk, NY (US)

(*) Notice: Subject to any disclaimer, the term of this patent is extended or adjusted under 35 U.S.C. 154(b) by 10 days.

(21) Appl. No.: 14/021,165

(22) Filed: Sep. 9, 2013

(65) Prior Publication Data

US 2014/0308806 A1     Oct. 16, 2014

Related U.S. Application Data

(63) Continuation of application No. 13/860,136, filed on Apr. 10, 2013.

(51) Int. Cl.
    *H01L 21/336*     (2006.01)
    *H01L 29/78*     (2006.01)
    (Continued)

(52) U.S. Cl.
    CPC ...... *H01L 29/7853* (2013.01); *H01L 29/66795* (2013.01); *H01L 21/306* (2013.01)

(58) Field of Classification Search
    USPC .......... 438/585, 300, 710–717, 719, 735–739
    See application file for complete search history.

(56) References Cited

U.S. PATENT DOCUMENTS 6,228,712 B1 *    5/2001    Kawai et al. .................. 438/257
7,547,637 B2       6/2009    Brask et al.
(Continued)

FOREIGN PATENT DOCUMENTS

KR        100762242 B1     6/2006

OTHER PUBLICATIONS

Baravelli et al., "Correlation of fin shape fluctuations to FinFET electrical variability and noise margins of 6-T SRAM cells" 10th International Conference on Ultimate Integration of Silicon (Mar. 18-20, 2009) pp. 19-22.

(Continued)

*Primary Examiner* — Savitr Mulpuri
(74) *Attorney, Agent, or Firm* — Scully, Scott, Murphy & Presser, P.C.; Louis J. Percello, Esq.

(57) ABSTRACT

A tapered fin field effect transistor can be employed to provide enhanced electrostatic control of the channel. A stack of a semiconductor fin and a dielectric fin cap having substantially vertical sidewall surfaces is formed on an insulator layer. The sidewall surfaces of the semiconductor fin are passivated by an etch residue material from the dielectric fin cap with a tapered thickness profile such that the thickness of the etch residue material decreased with distance from the dielectric fin cap. An etch including an isotropic etch component is employed to remove the etch residue material and to physically expose lower portions of sidewalls of the semiconductor fin. The etch laterally etches the semiconductor fin and forms a tapered region at a bottom portion. The reduced lateral width of the bottom portion of the semiconductor fin allows greater control of the channel for a fin field effect transistor.

11 Claims, 10 Drawing Sheets

(51) Int. Cl.
  *H01L 29/66* (2006.01)
  *H01L 21/306* (2006.01)

(56) References Cited

U.S. PATENT DOCUMENTS

| | | | |
|---|---|---|---|
| 7,560,798 B2 | 7/2009 | Nowak | |
| 7,964,466 B2 | 6/2011 | Bernstein et al. | |
| 8,071,983 B2 | 12/2011 | Brask et al. | |
| 2008/0280429 A1* | 11/2008 | Mathew et al. | 438/585 |
| 2011/0298041 A1 | 12/2011 | Renn | |
| 2012/0032237 A1 | 2/2012 | Brask et al. | |
| 2012/0086053 A1 | 4/2012 | Tseng et al. | |
| 2012/0146112 A1 | 6/2012 | Cheng et al. | |
| 2012/0161663 A1 | 6/2012 | Gregersen et al. | |
| 2012/0228676 A1 | 9/2012 | Tan et al. | |
| 2013/0277720 A1 | 10/2013 | Kim et al. | |
| 2014/0017362 A1 | 1/2014 | Nevian et al. | |
| 2014/0054650 A1* | 2/2014 | Colinge | 257/192 |
| 2014/0080276 A1* | 3/2014 | Brand et al. | 438/283 |
| 2014/0264490 A1* | 9/2014 | Ponoth et al. | 257/288 |
| 2014/0264603 A1* | 9/2014 | He et al. | 257/347 |

OTHER PUBLICATIONS

Office Action dated Feb. 18, 2015 received in U.S. Appl. No. 13/860,136.

* cited by examiner

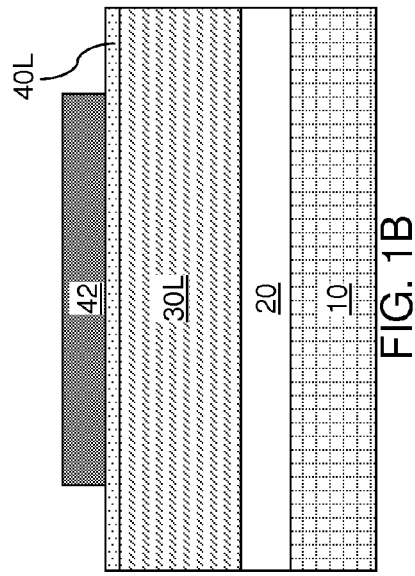
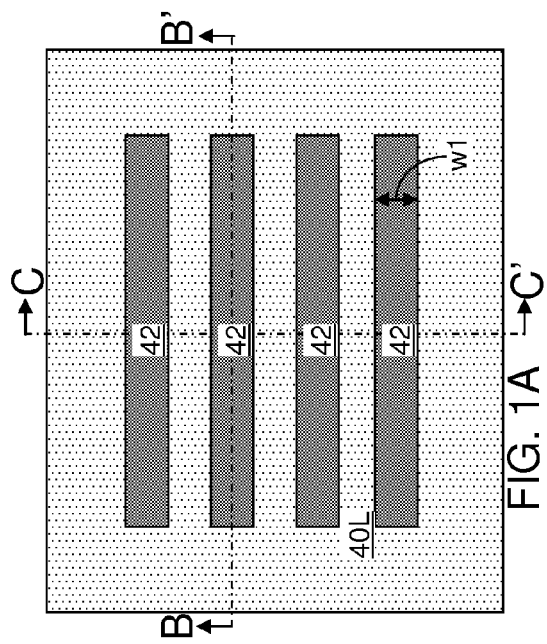
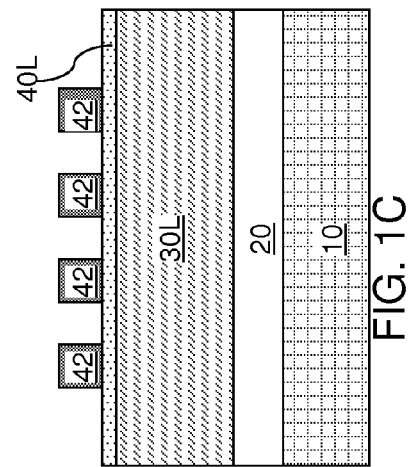
FIG. 1B
FIG. 1A
FIG. 1C

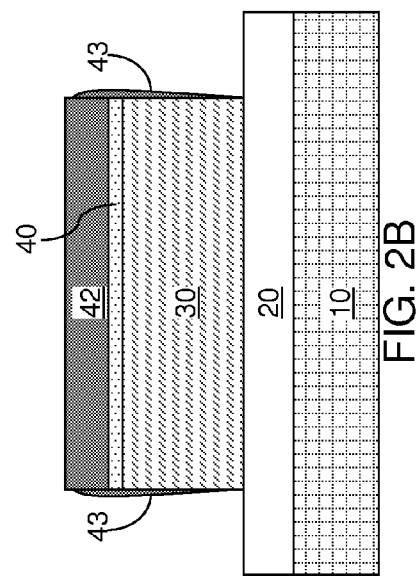
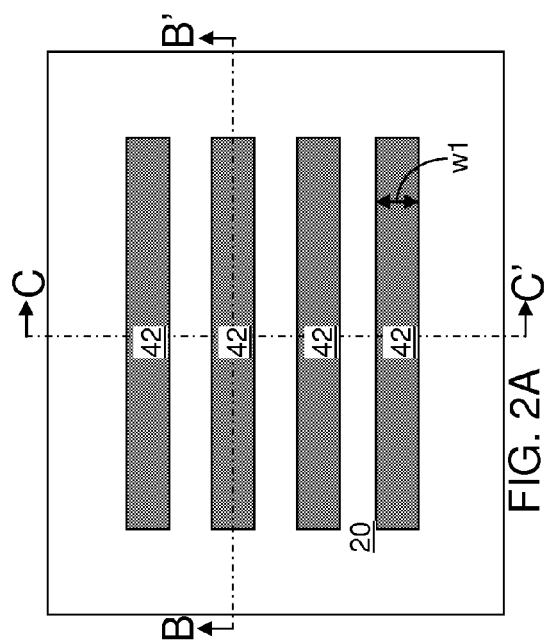
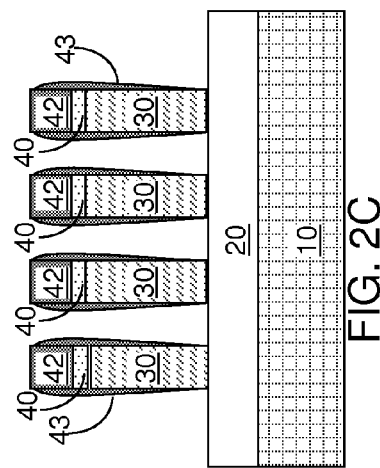

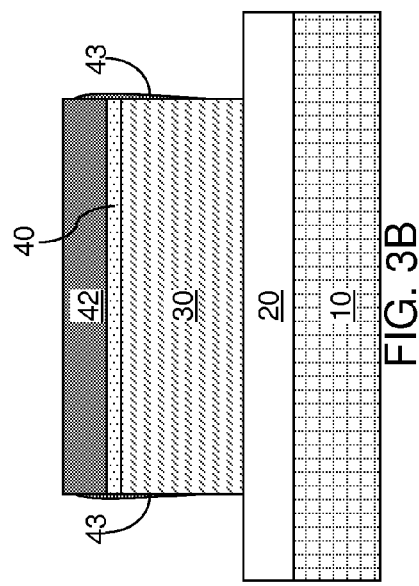
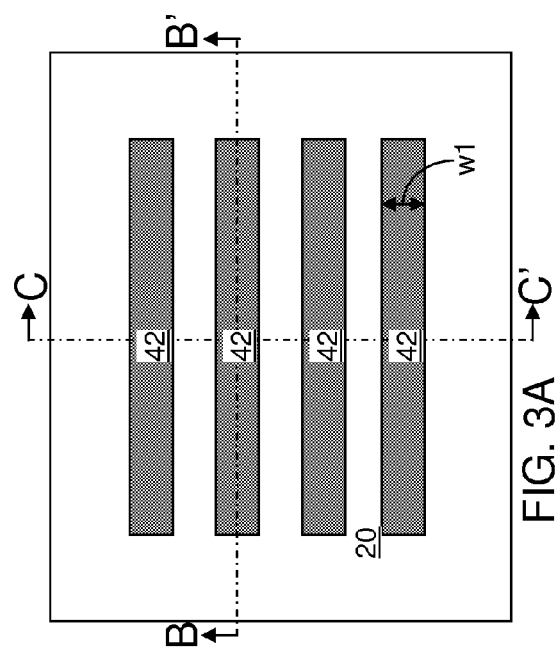
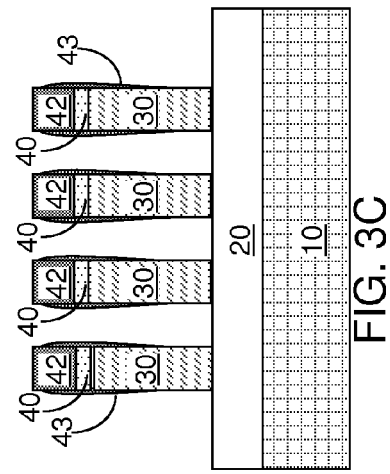
FIG. 3B
FIG. 3A
FIG. 3C

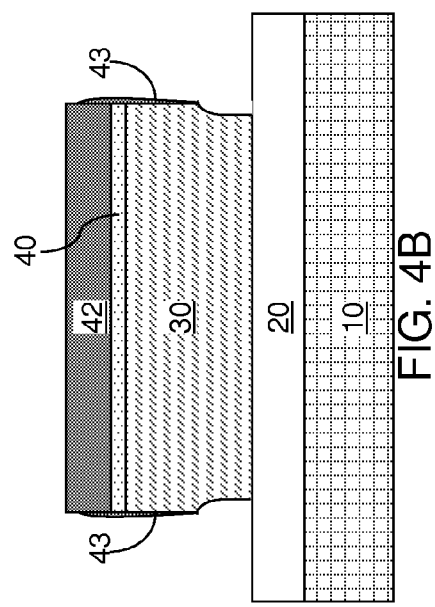
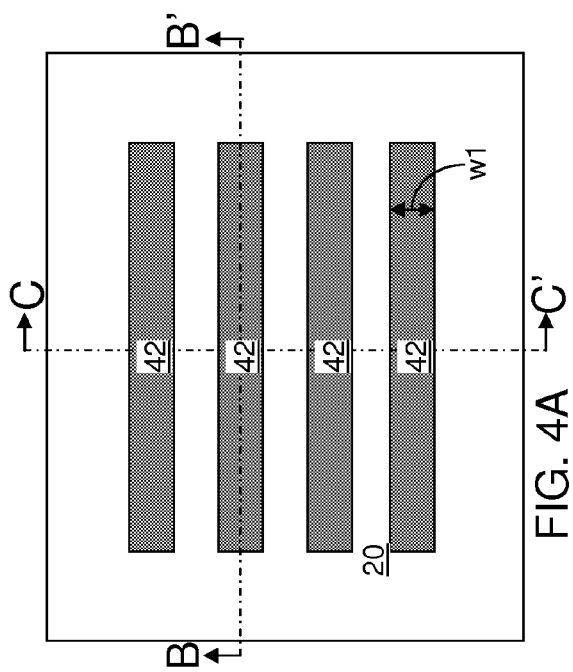
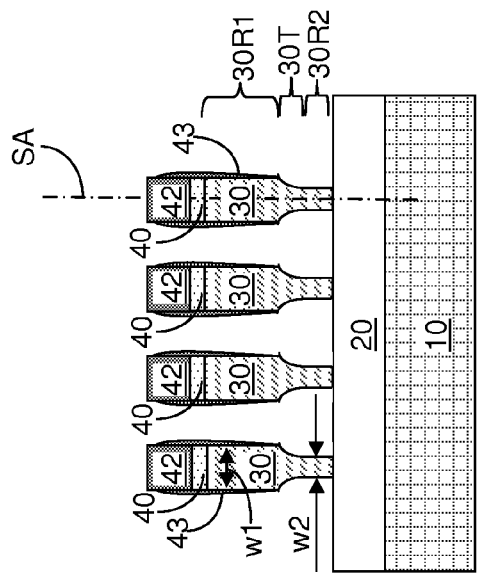

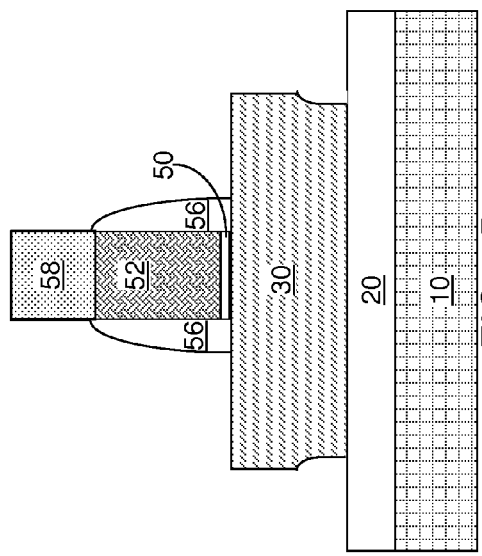
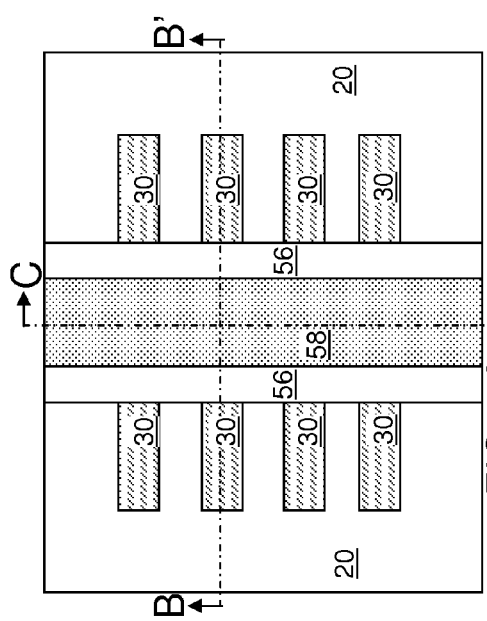
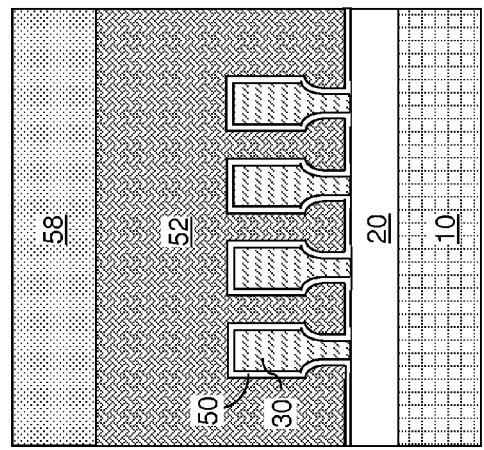

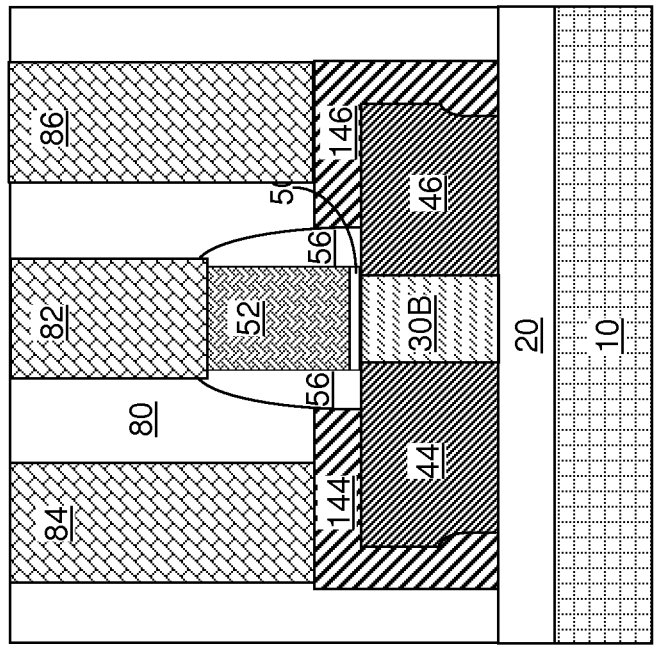
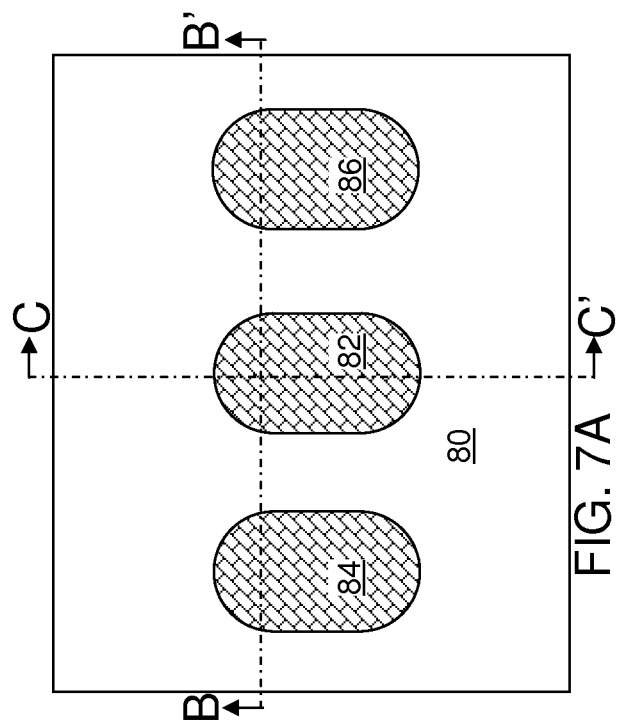

US 9,018,084 B2

TAPERED FIN FIELD EFFECT TRANSISTOR

CROSS REFERENCE TO RELATED APPLICATION

This application is a continuation of U.S. patent application Ser. No. 13/860,136, filed Apr. 10, 2013 the entire content and disclosure of which is incorporated herein by reference.

BACKGROUND

The present disclosure relates to a semiconductor structure, and particularly to fin field effect transistors including a tapered vertical cross-sectional area and a method of manufacturing the same.

As scaling of complementary metal oxide semiconductor (CMOS) devices continues, control of the channel through conventional means such as doping profile control and gate dielectric scaling becomes increasingly challenging. A few categories of devices such as fin field effect transistors, trigate transistors, and nanowire transistors circumvent the short channel behavior due to scaling.

SUMMARY

A tapered fin field effect transistor can be employed to provide enhanced electrostatic control of the channel. A stack of a semiconductor fin and a dielectric fin cap having substantially vertical sidewall surfaces is formed on an insulator layer. The sidewall surfaces of the semiconductor fin are passivated by an etch residue material from the dielectric fin cap with a tapered thickness profile such that the thickness of the etch residue material decreased with distance from the dielectric fin cap. An etch including an isotropic etch component is employed to remove the etch residue material and to physically expose lower portions of sidewalls of the semiconductor fin. The etch laterally etches the semiconductor fin and forms a tapered region at a bottom portion. The reduced lateral width of the bottom portion of the semiconductor fin allows greater control of the channel for a fin field effect transistor.

According to an aspect of the present disclosure, a semiconductor structure includes a semiconductor fin located on a substrate and laterally extending along a lengthwise direction. The semiconductor fin has a substantially same vertical cross-sectional shape that includes a vertically tapered portion in which a width of sidewalls increases with a vertical distance between a horizontal interface between the substrate and the semiconductor fin.

According to another aspect of the present disclosure, a method of forming a semiconductor structure is provided. A fin-defining mask structure is formed over a semiconductor layer that is located on a substrate. A semiconductor fin is formed, which laterally extends along a lengthwise direction with a substantially rectangular vertical cross-sectional shape that adjoins a horizontal interface with a top surface of the substrate. An etch residue material with a non-uniform thickness profile covers sidewalls of the semiconductor fin. The substantially rectangular vertical cross-sectional shape is modified into a substantially same vertical cross-sectional shape that includes a vertically tapered portion. In the vertically tapered portion, a width of sidewalls increases with a vertical distance between a horizontal interface between the substrate and the semiconductor fin. The modification of the substantially rectangular vertical cross-sectional shape can be performed by a lateral etch of the semiconductor fin while a thickness profile of the etch residue material is non-uniform.

BRIEF DESCRIPTION OF SEVERAL VIEWS OF THE DRAWINGS

FIG. 1A is a top-down view of a first exemplary semiconductor structure after formation of an optional dielectric liner layer and a plurality of fin-defining mask structures according to a first embodiment of the present disclosure.

FIG. 1B is a vertical cross-sectional view of the first exemplary semiconductor structure along the vertical plane B-B' of FIG. 1A.

FIG. 1C is a vertical cross-sectional view of the first exemplary semiconductor structure along the vertical plane C-C' of FIG. 1A.

FIG. 2A is a top-down view of the first exemplary semiconductor structure after formation of semiconductor fins having substantially vertical sidewalls after a first anisotropic etch according to the first embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 3A is a top-down view of the first exemplary semiconductor structure during a second anisotropic etch process, in which lower portions of the sidewalls of the semiconductor fins are physically exposed according to the first embodiment of the present disclosure.

FIG. 3B is a vertical cross-sectional view of the selected region of the first exemplary semiconductor structure along the vertical plane B-B' of FIG. 3A.

FIG. 3C is a vertical cross-sectional view of the selected region of the first exemplary semiconductor structure along the vertical plane C-C' of FIG. 3A.

FIG. 4A is a top-down view of the first exemplary semiconductor structure after the second anisotropic etch that laterally etches the lower portions of the sidewalls of the semiconductor fins according to the first embodiment of the present disclosure.

FIG. 4B is a vertical cross-sectional view of the first device region of the first exemplary semiconductor structure along the vertical plane B-B' of FIG. 4A.

FIG. 4C is a vertical cross-sectional view of the first device region of the first exemplary semiconductor structure along the vertical plane C-C' of FIG. 4A.

FIG. 5A is a top-down view of the first device region of the first exemplary semiconductor structure after formation of a gate dielectric, a gate electrode, and a gate spacer according to the first embodiment of the present disclosure.

FIG. 5B is a vertical cross-sectional view of the first device region of the first exemplary semiconductor structure along the vertical plane B-B' of FIG. 5A.

FIG. 5C is a vertical cross-sectional view of the first device region of the first exemplary semiconductor structure along the vertical plane C-C' of FIG. 5A.

FIG. 7A is a top-down view of the first device region of the first exemplary semiconductor structure after formation of a contact level dielectric layer and contact via structures according to the first embodiment of the present disclosure.

FIG. 7B is a vertical cross-sectional view of the first device region of the first exemplary semiconductor structure along the vertical plane B-B' of FIG. 7A.

DETAILED DESCRIPTION

Figure 6A:
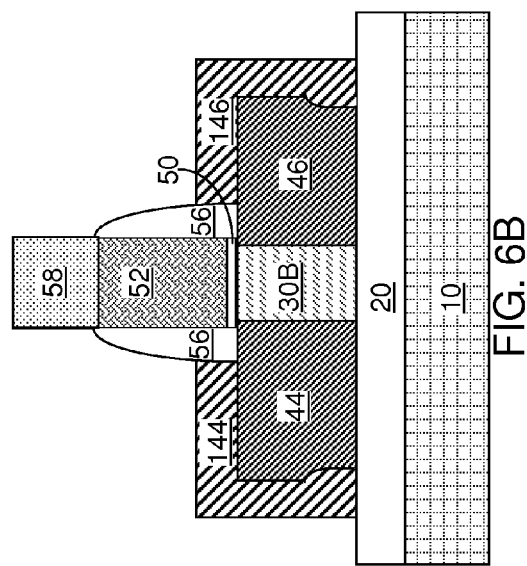
FIG. 6A is a top-down view of the first exemplary semiconductor structure after formation of a raised source region and a raised drain region according to the first embodiment of the present disclosure.

As stated above, the present disclosure relates to fin field effect transistors including a tapered vertical cross-sectional area and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A-1C, a first exemplary semiconductor structure according to a first embodiment of the present disclosure includes a vertical stack of a handle substrate 10, and an insulator layer 20, and a semiconductor layer 30L.

The handle substrate 10 can include a semiconductor material, an insulator material, or a conductive material. The handle substrate 10 provides mechanical support to the insulator layer 20 and the semiconductor layer 30L. The handle substrate 10 can be single crystalline, polycrystalline, or amorphous. The thickness of the handle substrate 10 can be from 50 microns to 2 mm, although lesser and greater thicknesses can also be employed.

The insulator layer 20 includes a dielectric material. Non-limiting examples of the insulator layer 20 include silicon oxide, silicon nitride, sapphire, and combinations or stacks thereof. The thickness of the insulator layer 20 can be, for example, from 100 nm to 100 microns, although lesser and greater thicknesses can also be employed. The handle substrate 10 and the insulator layer 20 collectively functions as a substrate on which the semiconductor layer 30L is located.

The semiconductor layer 30L includes a semiconductor material. The semiconductor material of the semiconductor layer 30L can be an elemental semiconductor material, an alloy of at least two elemental semiconductor materials, a compound semiconductor material, or a combination thereof. The semiconductor layer 30L can be intrinsic or doped with electrical dopants of p-type or n-type. The semiconductor material of the semiconductor layer 30L can be single crystalline or polycrystalline. In one embodiment, the semiconductor layer 30L can be a single crystalline semiconductor layer. In one embodiment, the semiconductor material of the semiconductor layer 30L can be single crystalline silicon. The thickness of the semiconductor layer 30L can be, for example, from 10 nm to 300 nm, although lesser and greater thicknesses can also be employed.

An optional dielectric liner layer 40L can be formed on the top surface of the semiconductor layer 30L. The optional dielectric liner layer 40L includes a dielectric material, which can be, for example, silicon oxide, silicon oxynitride, a dielectric metal oxide, or a combination thereof. The optional dielectric liner layer 40L can be formed, for example, by chemical vapor deposition (CVD) or conversion of a topmost portion of the semiconductor layer 30L by thermal oxidation, thermal nitridation, plasma oxidation, plasma nitridation, or a combination thereof. In one embodiment, the optional dielectric liner 40L can be thermal oxide of the semiconductor material of the semiconductor layer 30L. The thickness of the optional dielectric liner layer 40L can be from 1 nm to 20 nm, although lesser and greater thicknesses can also be employed.

A plurality of fin-defining mask structures 42 is formed over the semiconductor layer 30L. Each plurality of fin-defining mask structures 42 can be formed directly on the optional dielectric liner layer 40L, if present. The plurality of fin-defining mask structures 42 is a set of mask structures that cover the regions of the semiconductor layer 30L that are subsequently converted into semiconductor fins. Thus, the plurality of fin-defining mask structures 42 is subsequently employed to define the area of the semiconductor fins. The plurality of fin-defining mask structures 42 can include a dielectric material such as silicon nitride, silicon oxide, and silicon oxynitride. In one embodiment, the plurality of fin-defining mask structures 42 can includes a material selected from an undoped silicate glass (USG), a fluorosilicate glass (FSG), a phosphosilicate glass (PSG), a borosilicate glass (BSG), and a borophosphosilicate glass (BPSG).

The plurality of fin-defining mask structures 42 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 42. In one embodiment, each fin-defining mask structure 42 can laterally extend along a lengthwise direction. Further, each fin-defining mask structure 42 can have a pair of sidewalls that are separated along a widthwise direction, which is perpendicular to the lengthwise direction. In one embodiment, each fin-defining mask structure 42 can have a rectangular horizontal cross-sectional area. In one embodiment, each fin-defining mask structures 42 can have the same width w.

Referring to FIGS. 2A-2C, the semiconductor layer 30L is patterned to form a plurality of semiconductor fins 30. The formation of the plurality of semiconductor fins 30 can be performed employing a first anisotropic etch process, which can be a reactive ion etch. The plurality of semiconductor fins 30 has substantially same horizontal cross-sectional shapes as the fin-defining mask structures 42. As used herein, two shapes are "substantially same" if the differences between the two shapes is due to atomic level roughness and does not exceed 2 nm. The semiconductor layer 30L is etched employing the first anisotropic etch process in which the plurality of fin-defining mask structures 42 is employed as an etch mask. The plurality of semiconductor fins 30 is formed on the insulator layer 20. In one embodiment, the plurality of semiconductor fins 30 can include a single crystalline semiconductor material, and can have the same width w.

The optional dielectric liner layer 40L, if present, is patterned into at least one optional dielectric liner portion 40. The sidewalls of each optional dielectric liner portion 40 can be vertically coincident with sidewalls of an overlying fin-defining mask structure 42 and with sidewalls of an underlying semiconductor fin 30. As used herein, a first surface and a second surface are vertically coincident if the first surface and the second surface are within a same vertical plane.

The plurality of semiconductor fins 30 has substantially vertical sidewalls. As used herein, a surface is "substantially vertical" if the difference between the surface and a vertical surface is due to atomic level roughness and does not exceed 2 nm. Each of the plurality of semiconductor fins 30 can be a single crystalline semiconductor fin that laterally extends along a lengthwise direction. As used herein, a "lengthwise direction" is a horizontal direction along which an object extends the most. A "widthwise direction" is a horizontal direction that is perpendicular to the lengthwise direction.

Each of the plurality of semiconductor fins 30 extends along the lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction. The handle substrate 10 and the insulator layer 20 collectively functions as a substrate on which the plurality of semiconductor fins 30 is located. The substantially rectangular vertical cross-sectional shape adjoins a horizontal interface with a top surface of the combination of the insulator layer 20 and the handle substrate 10, i.e., the substrate (10, 20).

An etch residue material with a non-uniform thickness profile covers sidewalls of each semiconductor fin 30. Specifically, an etch residue material portion 43 having a non-uniform thickness profile is formed on each sidewall (shown in FIG. 2C) that extends along the lengthwise direction and on each end wall (shown in FIG. 2B) that extends along the widthwise direction. As used herein, the sidewalls of the plurality of semiconductor fins 30 that extend along the widthwise direction are referred to as "end walls." The end walls of the plurality of semiconductor fins 30 are located at the lengthwise end of each semiconductor fin 30. In one embodiment, the non-uniform thickness profile can provide an increasing thickness of the etch residue material with a vertical distance from a horizontal interface between the plurality of semiconductor fins 30 and the insulator layer 20.

In one embodiment, an etch chemistry including $O_2$, HBr, $CH_2F_2$, and $SF_6$ can be employed during the first anisotropic etch that forms the plurality of semiconductor fins 30 and the etch residue material portions 43. In a non-limiting example, if the substrate (10, 20) is a circular substrate having a diameter of 300 mm, the first anisotropic etch can be performed in a process chamber by a two-step anisotropic etch process.

In the first step of the first anisotropic etch process, a combination of gases including $CH_2F_2$ gas at a flow rate in a range from 15 sccm to 60 sccm, $SF_6$ gas at a flow rate in a range from 5 sccm to 20 sccm, $Cl_2$ gas at a flow rate in a range from 22.5 sccm to 90 sccm, $N_2$ gas at a flow rate in a range from 22.5 sccm to 90 sccm, and He gas at a flow rate in a range from 100 sccm to 400 sccm can be flowed into a reactive ion etch process chamber. The pressure of the process chamber can be in a range from 2.5 mTorr to 10 mTorr, and the radio frequency (RF) power applied by the RF source can be in a range from 225 W to 900 W, and the RF bias power can be in a range from 30 W to 120 W.

In the second step of the first anisotropic etch process, a combination of gases including $O_2$ and a bromine-including gas such as $Br_2$, HBr, $CH_3Br$, $CH_2Br_2$, $CHBr_3$, and other hydrobromocarbon gases can be employed.

In a non-limiting example, if the substrate (10, 20) is a circular substrate having a diameter of 300 mm, the second step of the first anisotropic etch can be performed in a process chamber by flowing a combination of gases including HBr gas at a flow rate in a range from 150 sccm to 600 sccm and $O_2$ gas at a flow rate in a range from 7.5 sccm to 30 sccm. The pressure of the process chamber can be in a range from 2 mTorr to 8 mTorr, and the radio frequency (RF) power applied by the RF source can be in a range from 200 W to 800 W, and the RF bias power can be in a range from 45 W to 180 W. The second step of the first anisotropic etch can have a fixed duration, which can be in a range from 7.5 second to 30 seconds. Various adjustments can be made to the etch chemistry, the pressure, and the RF powers as needed. The second step of the first anisotropic etch process can be an endpointed etch that terminate within a predetermined overetch time after detection of the top surface of the insulator layer 20. If the plurality of semiconductor fins 30 includes single crystalline silicon, the average etch rate of the first anisotropic etch process can be in a range from 12.5 nm/sec to 50 nm/sec. Various adjustments can be made to the etch chemistry, the pressure, and the RF powers as needed.

In one embodiment, the etch residue material can include a compound formed by a chemical reaction of an etchant gas employed in the first anisotropic etch process and the dielectric material of the plurality of fin-defining mask structures 42. The etch residue is formed by interaction of the difluoromethane gas and the semiconductor material on the sidewalls of the plurality of semiconductor fins 30. The etch residue can include a compound including silicon atoms, carbon atoms, hydrogen atoms, and fluorine atoms, and passivates the sidewalls of the plurality of semiconductor fins 30, thereby preventing a lateral etch of the plurality of semiconductor fins 30 during the first anisotropic etch step. The thickness of the etch residue is non-uniform, and increases with a vertical distance from the top surface of the substrate (10, 20) because the upper portions of the plurality of semiconductor fins 30 are exposed to the etch gases for a longer duration of time than the lower portions of the plurality of semiconductor fins 30. The maximum thickness of the etch residue, which typically occurs at the topmost portions of the plurality of semiconductor fins 30, can be from 1.0 nm to 5.0 nm, and can be typically in a range from 1.5 nm to 3.0 nm. The minimum thickness of the etch residue occurs at the bottommost portions of the plurality of semiconductor fins 30, and can be in a range from 0.5 nm to 1.5 nm, although lesser and greater thicknesses can also be employed.

Referring to FIGS. 3A-3C, first exemplary semiconductor structure is shown after partially performing a second anisotropic etch process, i.e., during the second anisotropic etch process. The second anisotropic etch is performed to physically expose lower portions of the sidewalls and end walls of the plurality of semiconductor fins 30. The second anisotropic etch process is less anisotropic than the first anisotropic etch process, and includes an isotropic etch component. The isotropic etch component of the second anisotropic etch laterally thins the etch residue material portions 43. Portions of sidewalls of the plurality of semiconductor fins 30 become physically exposed in regions at which the thickness of the etch residue material portions 43 is less than the cumulative etch distance of the second anisotropic etch, while remaining portions of the etch residue material portions 43 cover underlying portions of the sidewalls of the plurality of semiconductor fins 30. Specifically, the second anisotropic etch can partially remove the etch residue material portions 43 such that sidewall surfaces (and end wall surfaces) of the plurality of semiconductor fins 30 are physically exposed at a lower portion of each semiconductor fin 30, while a remaining portion of each etch residue material portion 43 covers an upper portion of each semiconductor fins 30.

In one embodiment, the second anisotropic etch process can be a dry etch process employing at least one bromine-containing gas and oxygen gas. In a non-limiting example, if the substrate (10, 20) is a circular substrate having a diameter of 300 mm, the second anisotropic etch can be performed in a process chamber by flowing a combination of gases including HBr gas at a flow rate in a range from 175 sccm to 700 sccm, $O_2$ gas at a flow rate in a range from 6 sccm to 24 sccm, helium gas at a flow rate in a range from 100 sccm to 400 sccm. The pressure of the process chamber can be in a range from 37.5 mTorr to 150 mTorr, and the radio frequency (RF) power applied by the RF source can be in a range from 200 W to 800 W, and the RF bias power can be in a range from 45 W to 180 W. The second anisotropic etch can have a fixed duration, which can be in a range from 20 second to 80 seconds. Various adjustments can be made to the etch chemistry, the pressure, and the RF powers as needed.

Referring to FIGS. 4A-4C, the second anisotropic etch is continued to laterally etch the physically exposed lower portions of the sidewalls (and end walls) of the plurality of semiconductor fins 30. The substantially rectangular vertical cross-sectional shape of each of the plurality of semiconductor fins 30 is modified into a substantially same vertical cross-sectional shape. The substantially same vertical cross-sectional shape includes a vertically tapered portion in which a width of sidewalls increases with a vertical distance between the horizontal interface between the substrate (10, 20) and the plurality of semiconductor fins 30. The lateral etch of the plurality of semiconductor fins 30 is performed while the thickness profile of the etch residue material portions 43 remains non-uniform. In one embodiment, an upper portion of each semiconductor fin 30 can be protected from the lateral etch by a remainder of an etch residue material portion 43 throughout the lateral etch.

The substantially same vertical cross-sectional shape can have a mirror symmetry around a vertical axis SA passing through the geometrical center of the substantially same vertical cross-sectional shape. The vertical axis SA is the symmetry axis of the mirror symmetry.

The substantially same vertical cross-sectional shape can further include a rectangular portion having the same width as the maximum width of the vertically tapered portion and adjoining an upper end of the vertically tapered portion. In addition, the substantially same vertical cross-sectional shape can further include another rectangular portion having a same width as the minimum width of the vertically tapered portion and adjoining a lower end of the vertically tapered portion. In one embodiment, the sidewalls of the vertically tapered portion of each semiconductor fin 30 can be concave sidewalls.

During the lateral etch, i.e., the second anisotropic etch, end walls of the plurality of semiconductor fins 30 having the substantially rectangular vertical cross-sectional shape within vertical planes perpendicular to the lengthwise direction are laterally etched in the same manner as the substantially vertical sidewalls of the plurality of semiconductor fins 30 that extend along the lengthwise direction. In this case, a vertical cross-sectional shape of each semiconductor fin 30 after the lateral etch along a vertical plane including the lengthwise direction can include a pair of tapered edges such that each of the tapered edges is congruent with a tapered edge of the substantially same vertical cross-sectional shape that is a cross-sectional shape of a semiconductor fin 30 along a plane perpendicular to the lengthwise direction.

The first exemplary semiconductor structure includes at least one semiconductor fin 30 that is located on the substrate (10, 20). Each of the at least one semiconductor fin 30 laterally extends along the lengthwise direction with the substantially same vertical cross-sectional shape. A vertical cross-sectional shape of each semiconductor fin 30 along a vertical plane including the lengthwise direction (e.g., as in FIG. 4B) includes a pair of tapered edges. Each of the tapered edges within a vertical cross-sectional shape along a vertical plane including the lengthwise direction is congruent with a tapered edge of the substantially same vertical cross-sectional shape, which is a cross-sectional shape along a plane including the widthwise direction (e.g., as in FIG. 4C). As used herein, a two-dimensional shape is congruent with another two-dimensional shape if a combination of rotation and translation that matches the two two-dimensional shapes exists.

With the plurality of semiconductor fins 30, each semiconductor fin 30 is laterally spaced from another semiconductor fin 30, extends in directions that are parallel to the lengthwise direction, and has the substantially same vertical cross-sectional shape.

Referring to FIGS. 5A-5C, the optional dielectric liner portions 40 and the fin-defining mask structures 42 can be removed selective to the plurality of semiconductor fins 30. The removal of the optional dielectric liner portions 40 and the fin-defining mask structures 42 can be effected by an etch, which can be a wet etch or a dry etch. The optional dielectric liner portions 40 and the fin-defining mask structures 42 can be removed by a wet etch that removes dielectric materials selective to semiconductor materials. For example, a wet etch employing hot phosphoric acid can be employed to remove silicon nitride and/or a wet etch employing hydrofluoric acid can be employed to remove silicon oxide.

A stack of a gate dielectric 50, a gate electrode 52, and a gate cap dielectric 58 can be formed across the plurality of semiconductor fins 30 such that the stack (50, 52, 58) straddles each of the plurality of semiconductor fins 30. The gate dielectric 50 is in contact with a top surface and sidewall surfaces of each semiconductor fin 30. The gate electrode 52 is in contact with the gate dielectric 50.

The formation of the gate dielectric 50 and the gate electrode 52 can be effected, for example, by deposition of a stack of a gate dielectric layer, a gate electrode layer, and a gate cap dielectric layer, and by subsequent patterning of the gate cap dielectric layer, the gate electrode layer, and the gate dielectric layer. The patterning of the gate cap dielectric layer and the gate electrode layer can be performed employing a combination of lithographic methods and at least one anisotropic etch. The patterning of the gate dielectric layer can be performed by an isotropic etch that is selective to the semiconductor material of the plurality of semiconductor fins 30.

Figure 6B:
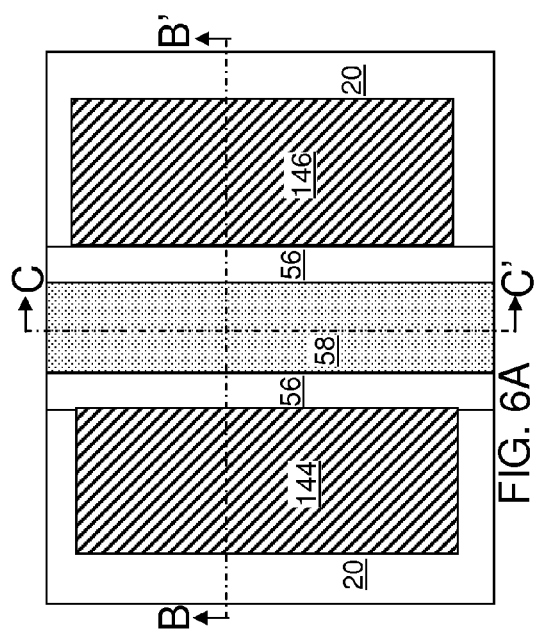
FIG. 6B is a vertical cross-sectional view of the first device region of the first exemplary semiconductor structure along the vertical plane B-B' of FIG. 6A.
Figure 6C:
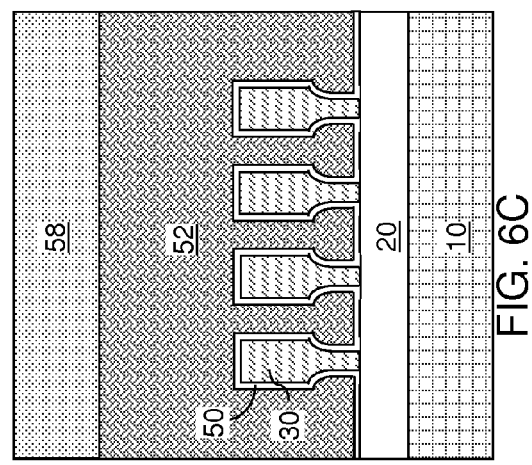
FIG. 6C is a vertical cross-sectional view of the first device region of the first exemplary semiconductor structure along the vertical plane C-C' of FIG. 6A.

Referring to FIGS. 6A-6C, a raised source region 144 and a raised drain region 146 can be formed, for example, by selective deposition of a semiconductor material. The raised source region 144 and the raised drain region 146 are doped with electrical dopants, which can be p-type dopants or n-type dopants. If the plurality of semiconductor fins 30 is doped with dopants of a first conductivity type, the raised source region 144 and the raised drain region 146 are doped with dopants of a second conductivity type, which is the opposite of the first conductivity type. If the first conductivity type is p-type, the second conductivity type is n-type, and vice versa.

The doping of the raised source region 144 and the raised drain region 146 can be performed by in-situ doping, i.e., during deposition of the raised source region 144 and the raised drain region 146, or by ex-situ doping, i.e., after deposition of the raised source region 144 and the raised drain region 146. Exemplary methods for performing the ex-situ doping include, but are not limited to, ion implantation, plasma doping, and outdiffusion of dopants from a disposable dopant-including material that is temporarily deposited and subsequently removed.

A portion of each semiconductor fin 30 that underlies the raised source region 144 is converted into a source region 44, and a portion of each semiconductor fin 30 that underlies the raised drain region 146 is converted into a drain region 46. The source regions 44 and the drain regions 46 have the same type of doping as the raised source region 144 and the raised drain region 146. The doping of the source regions 44 and the drain regions 46 can be performed by ion implantation prior to, or after, formation of the raised source region 144 and the raised drain region 146, and/or by outdiffusion of dopants from the raised source region 144 and the raised drain region 146.

The portion of each semiconductor fin 30 that is not converted into a source region 44 or a drain region 46 constitutes a body region 30B. The body regions 30B collectively function as a body of a field effect transistor. The source regions 44 and the raised source region 144 collectively function as a source of the field effect transistor. The drain regions 46 and the raised drain region 146 collectively function as a drain of the field effect transistor.

The raised source region 144 is in contact with the source regions 44 and is located outside the plurality of semiconductor fins (30B, 44, 46). The raised drain region 146 is in contact with the drain regions 46 and is located outside the semiconductor fins (30B, 44, 46).

In one embodiment, the plurality of semiconductor fins 30 can be a plurality of single crystalline semiconductor fins, and the raised source region 144 and the raised drain region 146 can be formed by selective epitaxy such that the raised source region 144 and the raised drain region 146 are in epitaxial alignment with the plurality of single crystalline semiconductor fins.

Figure 7C:
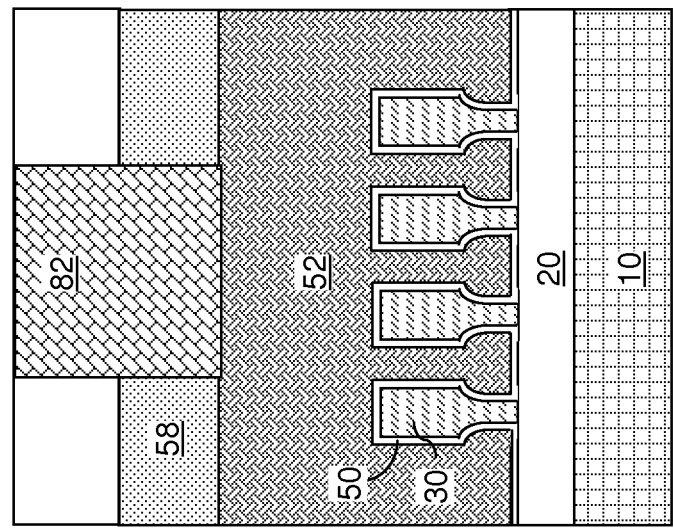
FIG. 7C is a vertical cross-sectional view of the first device region of the first exemplary semiconductor structure along the vertical plane C-C' of FIG. 7A.

Referring to FIGS. 7A-7C, a contact level dielectric layer 80 and various contact via structures (82, 84, 86) can be formed to provide electrical contact to the combination of the source regions 44 and the raised source region 144, the combination of the drain regions 46 and the raised drain region 146, and the gate electrode 52 of the field effect transistor.

Figure 8:
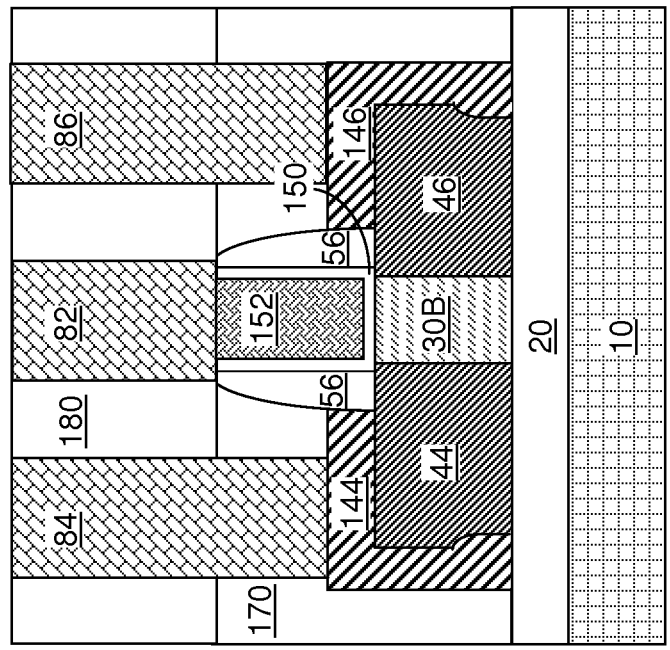
FIG. 8 is a vertical cross-sectional view of a variation of the first exemplary semiconductor structure according to the first embodiment of the present disclosure.

Referring to FIG. 8, a variation of the first exemplary semiconductor structure can be derived from the first exemplary semiconductor structure by employing a replacement gate integration scheme. For example, a disposable gate stack can be formed in lieu of the stack of the gate dielectric 50, the gate electrode 52, and the gate cap dielectric 58. After formation of a gate spacer 56, source regions 44, drain regions 46, body region 30B, a raised source region 144, and a raised drain region 146 are formed. Subsequently, a planarization dielectric layer 170 is deposited and planarized. The disposable gate stack is removed to form a gate cavity, in which a replacement gate dielectric 150 having a U-shaped vertical cross-sectional shape and a replacement gate electrode 152 are formed. A contact level dielectric layer 180 can be subsequently formed above the planarization dielectric layer 170, and various contact via structures (82, 84, 86) are formed therethrough to provide electrical contact to the combination of the source regions 44 and the raised source region 144, the combination of the drain regions 46 and the raised drain region 146, and the gate electrode 52 of the field effect transistor.

Figure 9B:
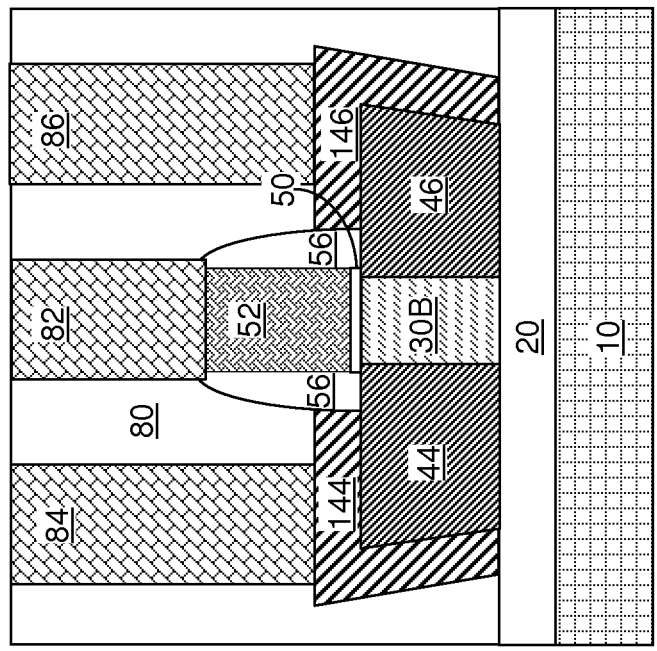
FIG. 9B is a vertical cross-sectional view of the first device region of the second exemplary semiconductor structure along the vertical plane B-B' of FIG. 9A.
Figure 9A:
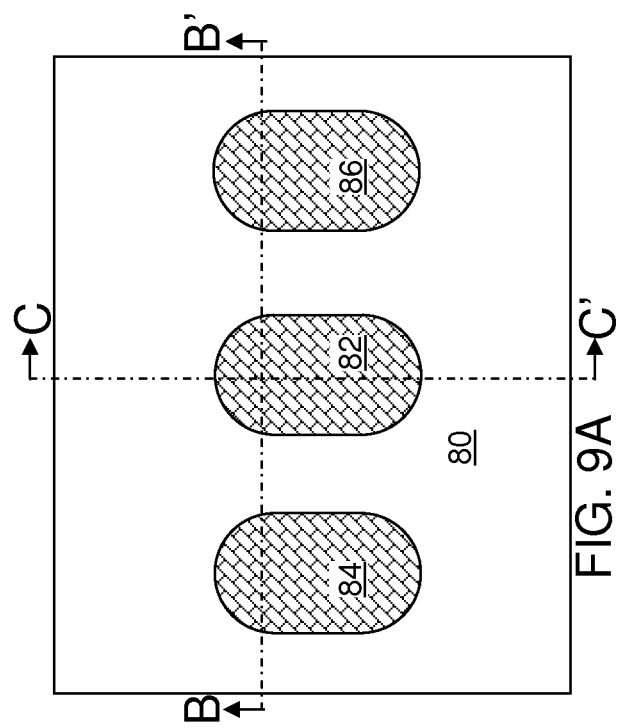
FIG. 9A is a top-down view of a second exemplary semiconductor structure after formation of a contact level dielectric layer and contact via structures according to a second embodiment of the present disclosure.
Figure 9C:
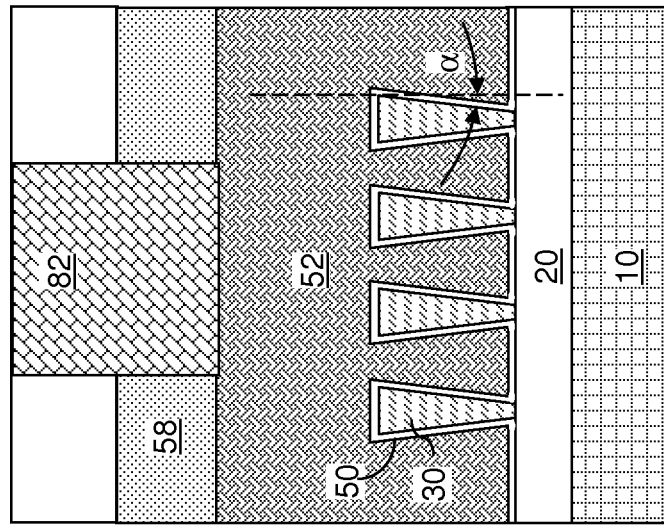
FIG. 9C is a vertical cross-sectional view of the first device region of the second exemplary semiconductor structure along the vertical plane C-C' of FIG. 9A.

Referring to FIGS. 9A-9C, a second exemplary semiconductor structure according to a second embodiment of the present disclosure can be derived from the first exemplary semiconductor structure by altering the second anisotropic etch. Specifically, a lateral etch that simultaneously removes the material of the etch residue material portions 43 and the semiconductor material of the plurality of semiconductor fins 30 can be employed in lieu of the second anisotropic etch processes employed at the processing steps of FIGS. 3A-3C and 4A-4C. The lateral etch can be an anisotropic etch including an isotropic etch component or an isotropic etch.

In one embodiment, the removal of the material of the etch residue material portions 43 can be performed such that the sidewall surfaces (and end surfaces) of the plurality of semiconductor fins 30 is performed gradually from bottom to top of the plurality of semiconductor fins 30, and each of the plurality of semiconductor fins 30 has a substantially rectangular vertical cross-sectional shape of a trapezoid in vertical planes that are perpendicular to the lengthwise direction of the plurality of semiconductor fins 30, i.e., in vertical planes that include a vertical direction and a widthwise direction. In one embodiment, a bottom side of the trapezoid can coincide with the horizontal interface between the insulator layer 20 and the semiconductor fins 30, and a top side of the trapezoid can coincide with a topmost surface of a semiconductor fin 30.

Each substantially same vertical cross-sectional shape can have a mirror symmetry around a vertical axis passing through the geometrical center of the substantially same vertical cross-sectional shape. In one embodiment, end walls of each semiconductor fin 30 can have the substantially rectangular vertical cross-sectional shape within vertical planes perpendicular to the lengthwise direction are laterally etched during the lateral etch. A vertical cross-sectional shape of the semiconductor fin after the lateral etch along a vertical plane including the lengthwise direction can include a pair of tapered edges, wherein each of the tapered edges is congruent with a tapered edge of the substantially same vertical cross-sectional shape.

Figure 10:
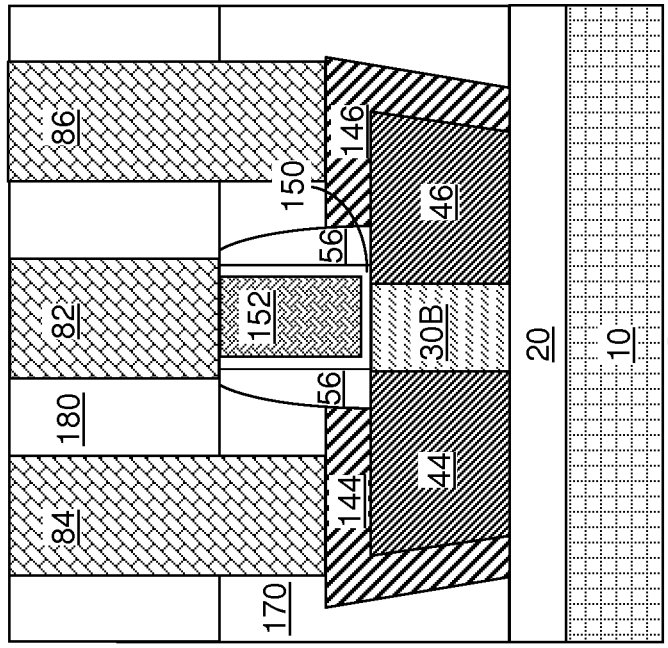
FIG. 10 is a vertical cross-sectional view of a variation of the second exemplary semiconductor structure according to the second embodiment of the present disclosure.

Referring to FIG. 10, a variation of the second exemplary semiconductor structure can be derived from the second exemplary semiconductor structure by employing a replacement gate integration scheme. For example, a disposable gate stack can be formed in lieu of the stack of the gate dielectric 50, the gate electrode 52, and the gate cap dielectric 58. After formation of a gate spacer 56, source regions 44, drain regions 46, body region 30B, a raised source region 144, and a raised drain region 146 are formed. Subsequently, a planarization dielectric layer 170 is deposited and planarized. The disposable gate stack is removed to form a gate cavity, in which a replacement gate dielectric 150 having a U-shaped vertical cross-sectional shape and a replacement gate electrode 152 are formed. A contact level dielectric layer 180 can be subsequently formed above the planarization dielectric layer 170, and various contact via structures (82, 84, 86) are formed therethrough to provide electrical contact to the combination of the source regions 44 and the raised source region 144, the combination of the drain regions 46 and the raised drain region 146, and the gate electrode 52 of the field effect transistor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
forming a fin-defining mask structure over a semiconductor layer located on a substrate;
forming, from said semiconductor layer, a semiconductor fin laterally extending along a lengthwise direction with a substantially rectangular vertical cross-sectional shape that adjoins a horizontal interface with a top surface of said substrate, wherein an etch residue material with a non-uniform thickness profile covers sidewalls of said semiconductor fin, wherein said non-uniform thickness profile provides an increasing thickness of said etch residue material with a vertical distance from said horizontal interface; and
modifying said substantially rectangular vertical cross-sectional shape into a substantially same vertical cross-sectional shape that includes a vertically tapered portion in which a width of sidewalls increases with a vertical distance between a horizontal interface between said substrate and said semiconductor fin by a lateral etch of said semiconductor fin while a thickness profile of said etch residue material is non-uniform, wherein an upper portion of said semiconductor fin having said substantially rectangular vertical cross-sectional shape is protected from said lateral etch by a portion of said etch residue material throughout said lateral etch.

2. The method of claim 1, wherein said lateral etch of said singe crystalline semiconductor fin is performed employing an etch process including an isotropic etch component.

3. The method of claim 2, wherein said anisotropic etch process is a dry etch process employing at least one hydrogen bromide gas.

4. The method of claim 1, wherein said forming of said semiconductor fin having said substantially rectangular vertical cross-sectional shape comprises etching said semiconductor layer employing an anisotropic etch process in which said fin-defining mask structure is employed as an etch mask.

5. The method of claim 4, wherein said etch residue material includes a compound formed by a chemical reaction of an etchant gas employed in said anisotropic etch process and a material of said fin-defining mask structure.

6. The method of claim 5, wherein said fin-defining mask structure comprises a material selected from an undoped silicate glass (USG), a fluorosilicate glass (FSG), a phosphosilicate glass (PSG), a borosilicate glass (BSG), and a borophosphosilicate glass (BPSG).

7. The method of claim 1, wherein said vertically tapered portion has concave sidewalls.

8. The method of claim 1, wherein said substantially rectangular vertical cross-sectional shape is a trapezoid.

9. The method of claim 1, wherein end walls of said semiconductor fin having said substantially rectangular vertical cross-sectional shape within vertical planes perpendicular to said lengthwise direction are laterally etched during said lateral etch.

10. The method of claim 9, wherein a vertical cross-sectional shape of said semiconductor fin after said lateral etch along a vertical plane including said lengthwise direction includes a pair of tapered edges, wherein each of said tapered edges is congruent with a tapered edge of said substantially same vertical cross-sectional shape.

11. The method of claim 1, further comprising forming a stack of a gate dielectric and a gate electrode directly on said semiconductor fin after said lateral etch.

* * * * *